(12) United States Patent
Harle et al.

(10) Patent No.: US 7,294,520 B2
(45) Date of Patent: Nov. 13, 2007

(54) METHOD FOR FABRICATING A PLURALITY OF SEMICONDUCTOR BODIES, AND ELECTRONIC SEMICONDUCTOR BODY

(75) Inventors: Volker Harle, Laaber (DE); Hans-Jürgen Lugauer, Sinzing (DE); Stephan Miller, Regensburg (DE); Stefan Bader, Eilsbrunn (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/780,317

(22) Filed: Feb. 17, 2004

(65) Prior Publication Data
US 2004/0192016 A1 Sep. 30, 2004

(30) Foreign Application Priority Data
Feb. 14, 2003 (EP) .................................. 03003442
Apr. 30, 2003 (DE) ............................... 103 19 555
May 6, 2003 (DE) ............................... 103 20 160

(51) Int. Cl.
*H01L 21/00* (2006.01)
(52) U.S. Cl. .......................... 438/44; 438/46; 438/492; 438/483; 438/767; 257/103; 257/E33.001
(58) Field of Classification Search ................. 438/46, 438/44, 492, 483, 767; 257/103
See application file for complete search history.

(56) References Cited
U.S. PATENT DOCUMENTS
5,684,309 A 11/1997 McIntosh et al.

(Continued)

FOREIGN PATENT DOCUMENTS
EP 1 017 133 7/2000

(Continued)

OTHER PUBLICATIONS
Y.H. Song et al.: "Lateral Epitaxial Overgrowth of GaN and Its Crystallographic Tilt Depending on the Growth Condition", Phys. Stat. Sol. (a) 180, (2000), pp. 247-250.

(Continued)

*Primary Examiner*—Zandra V. Smith
*Assistant Examiner*—Christy L Novacek
(74) *Attorney, Agent, or Firm*—Cohen Pontani Lieberman & Pavane LLP

(57) ABSTRACT

A method for fabricating a plurality of semiconductor bodies, in particular based on nitride compound semiconductor material. The method includes forming a mask layer (3) over a substrate (1) or over an initial layer (2), which mask layer has a plurality of windows (4) leading to the substrate (1) or to the initial layer (2), etching back the substrate (1) or the initial layer (2) in the windows (4), in such a manner that pits (41) are formed in the substrate (1) or in the initial layer (2) starting from these windows. The semiconductor material (5) is grown onto the substrate (1) or onto the initial layer (2), in such a manner that lateral growth is promoted and the semiconductor material initially grows primarily from the flanks (43) of the pits (41) toward the center (42) of the pits (41) where they form a coalescence region (61), so that defects in the substrate (1) or in the initial layer (2) which impinge on the flanks (43) of the pits (41) bend off toward the center of the pits (41) in the semiconductor material, and then, starting from the windows (4), the semiconductor material grows over the mask layer (3) and grows together over the mask layer (3) between adjacent windows (4), where it forms a further coalescence region (62). A component layer sequence (8) is grown onto the semiconductor material (5).

19 Claims, 4 Drawing Sheets

U.S. PATENT DOCUMENTS

| | | | |
|---|---|---|---|
| 5,831,277 | A | 11/1998 | Razeghi |
| 6,172,382 | B1 | 1/2001 | Nagahama et al. |
| 6,830,948 | B2 * | 12/2004 | Koike et al. .................. 438/46 |

FOREIGN PATENT DOCUMENTS

| | | |
|---|---|---|
| EP | 1 263 031 A1 | 4/2002 |
| WO | WO 98/31055 | 7/1998 |
| WO | WO 01/39282 | 5/2001 |

OTHER PUBLICATIONS

S. Tanaka et al.: "Anti-Surfactant in III Nitride Epitaxy-Quantum Dot Formation and Dislocation Termination", Jpn. J. Appl. Phys. vol. 39, pp. L831-L834 Part 2, No. 8Bd., Aug. 15, 2000.

Visconti et al.: "Dislocation density in GaN determined by photoelectrochemical and hot-wet Etching", Applied Physics Letters 77, No. 22, pp. 3532-3534, Nov. 27, 2000.

E. Feltin et al.: "Epitaxial Lateral Overgrowth of GaN on Silicon (111)", Phys. Stat. Sol. (a) 188, No. 2, pp. 733-737 (2001).

T. Gehrke et al.: "Pendeo-Epitaxy of Gallium Nitride and Aluminum Nitride Films and Heterostructures on Silicon Carbide Substrate", MRS Internet J. Semicond. Res. 4SI, G3.2 (1999).

P.R. Hagemann, et al.: "Improvement of the Optical and Structural Properties of MOCVD Grown GaN on Sapphire by an in-situ SiN Treatment", Phys. Stat. Sol. (a) 188, No. 2, (2001), pp. 659-662.

X. Li et al..: "GaN Epitaxial Lateral Overgrowth and Optical Characterization", Applied Physics Letters (1998), vol. 73, No. 9, pp. 1179-1181, Aug. 31, 1998.

B. Beaumont et al.: "Epitaxial Lateral Overgrowth of GaN", Phys. Stat. Sol. (b) 227 (2001), No. 1, pp. 1-43.

T.S. Zheleva et al.: "Pendeo-Epitaxy—A New Approach for Lateral Growth of Gallium Nitride Structures", MRS Internet J. Nitride Semicond. Res. 4S1, G3.38 (1999).

T. Wang et al.; "A new method for a great reduction of dislocation density in a GaN layer grown on a sapphire substrate", Journal of Crystal Growth 213 (2000), pp. 188-192.

H. Watanabe et al.: "Crystallographic Structure of FIELO-GaN Films Studied by Scanning Reflection Electron Microscopy", Workshop on Nitride Semiconductors, IPAP Conf., Serial 1, pp. 272-275.

K. J. Linthicum et al.: "Process Routes for Low Defect-Density GaN on Various Substrates Employing PENDEO-Epitaxial Growth Techniques", MRS Internet J. Nitride Semicond. Res. 4S1, G4.9 (1999).

* cited by examiner

METHOD FOR FABRICATING A PLURALITY OF SEMICONDUCTOR BODIES, AND ELECTRONIC SEMICONDUCTOR BODY

RELATED APPLICATIONS

This patent application claims the priority of German patent applications 10320160.2 and 10319555.6 as well as European patent application 03003442.5, the content of disclosure of each of which is hereby incorporated by reference.

FIELD OF THE INVENTION

The invention relates to a method for growing nitride compound semiconductor material, in particular selected from the system $In_xAl_yGa_{1-x-y}N$, where $0 \leq x \leq 1$, $0 \leq y \leq 1$ and $x+y \leq 1$, onto a substrate or onto an initial layer. It relates in particular to a method for fabricating corresponding radiation-emitting and/or radiation-detecting semiconductor chips for optoelectronic components and power transistors.

BACKGROUND OF THE INVENTION

Nitride compound semiconductor materials are compound semiconductor materials which contain nitrogen, such as the above-mentioned materials selected from the system $In_xAl_yGa_{1-x-y}N$, where $0 \leq x \leq 1$, $0 \leq y \leq 1$ and $x+y \leq 1$. In the present instance, the group of radiation-emitting and/or radiation-detecting semiconductor chips based on nitride compound semiconductor material include in particular semiconductor chips in which the epitaxially produced semiconductor layer, which generally includes a layer sequence comprising different individual layers, includes at least one individual layer which contains a material from the nitride compound semiconductor material system. The semiconductor layer may, for example, include a conventional pn junction, a double heterostructure, a single quantum well structure (SQW structure) or a multiple quantum well structure (MQW structure). Structures of this type are known to the person skilled in the art and are therefore not explained in more detail at the present juncture. Examples of MQW structures of this type are described in the documents WO 01/39282, WO 98/31055, U.S. Pat. No. 5,831,277, EP 1 017 113 and U.S. Pat. No. 5,684,309, the content of disclosure of each of which in this respect is hereby incorporated by reference.

It is known for a semiconductor material to be grown epitaxially on a substrate whose lattice constant is matched to the lattice constant of the semiconductor material in order to obtain an improved crystal quality and pure crystal defects. Hitherto, a lattice-matched substrate for the nitride compound semiconductor materials which is also sufficiently suitable for the mass production of semiconductor chips of this type has not been disclosed. Therefore, substrates based on sapphire, silicon carbide or spinel are frequently used, even though their lattice constant is not optimally matched to that of nitride compound semiconductor material.

Since it is intended to use the nitride compound semiconductors to fabricate optoelectronic components, in particular semiconductor lasers, and since these components may give off heat that is produced because of high electrical power losses of the components, the material sapphire is of only extremely limited suitability for the fabrication of power laser diodes, on account of its poor thermal conductivity.

It is also known to use special deposition processes to reduce the defect density in the semiconductor material. An example of a process of this nature for lateral overgrowth, which is often referred to as the LEO (lateral epitaxial overgrowth) process or the ELOG (epitaxial lateral overgrowth) process, is known from Song et al., Phys. Stat. Sol. (a) 180, 247 (2000), the content of which in this respect is hereby incorporated by reference.

In the process which is described therein for the production of a gallium nitride layer on a sapphire substrate, first of all a thin initial layer (seed layer) is grown on a sapphire substrate, and then a silicon nitride mask layer in strip form is applied to the thin initial layer. During subsequent deposition of trimethylgallium and ammonia, a plurality of gallium nitride layers grow between the mask strips. As soon as the gallium nitride layers have reached the thickness of the mask layer, lateral growth occurs in addition to the vertical growth, so that the mask layer is laterally overgrown by the gallium nitride layers. This process is continued until a continuous gallium nitride layer is present.

It has been found that the dislocation density in the gallium nitride layer produced by lateral overgrowth is advantageously low and is distinguished by a higher crystal quality in particular compared to a layer which is grown directly on the sapphire substrate.

SUMMARY OF THE INVENTION

One object of the present invention is to provide a method for fabricating a plurality of semiconductor chips which makes it possible to reduce the number of defects in the component layer sequence.

Another object of the present invention is to provide an electronic semiconductor chip which is produced in accordance with such a method.

These and other objects are attained in accordance with one aspect of the present invention directed to a method for fabricating a plurality of semiconductor bodies, in particular based on nitride compound semiconductor material. The method includes:

(a) forming a mask layer over or on a substrate or over or on an initial layer, which mask layer has a plurality of windows leading to the substrate or to the initial layer and onto which mask layer a semiconductor material, which is to be grown onto the substrate in a subsequent method step, substantially cannot be grown or can be grown to a significantly reduced extent by comparison with the substrate, (b) etching back the substrate or the initial layer in the windows, in such a manner that pits are formed in the substrate and/or if present in the initial layer starting from these windows, (c) growing the semiconductor material onto the substrate and/or if present onto the initial layer, in such a manner that lateral growth is promoted and the semiconductor material initially grows primarily from the flanks (or facets) of the pits toward the center of the pits where they form a coalescence region, so that defects in the substrate or in the initial layer which impinge on the flanks of the pits bend off toward the center of the pits in the semiconductor material, and end at the coalescence region or open out into the latter, and then, starting from the windows, grows over the mask layer and in each case grows together over the mask layer between adjacent windows, where it forms a further coalescence region, (d) growing a component layer sequence onto the semiconductor material, and (e) dividing the assembly comprising substrate, mask layer, semiconductor material and component layer sequence into individual semiconductor chips.

Another aspect of the present invention is directed to a method for fabricating a plurality of semiconductor bodies which includes forming a mask layer over an underlying layer, wherein the mask layer has a plurality of windows onto the underlying layer, and wherein the underlying layer comprises at least one of a substrate and an initial layer. Pits are etched in the underlying layer, through the windows in the mask layer. A semiconductor material is deposited by:

(i) growing the semiconductor material laterally from flanks of the pits in the underlying layer, wherein first coalescence regions are formed substantially in the center of each of the pits, wherein defects in the underlying layer which contact the sides of the pits propagate in the semiconductor material in a lateral direction toward the first coalescence regions; and (ii) growing the semiconductor material outward from the windows, as the windows become full of deposited semiconductor material, over the mask layer, wherein second coalescence regions are formed above the mask layer.

For the sake of completeness, it should also be noted that if an initial layer, which may be realized for example by a buffer layer which is known from conventional chip structures, is present, the pits may be formed only in this initial layer or may penetrate through the initial layer and extend into the substrate as well.

Materials such as silicon, silicon carbide, spinel or sapphire are examples of suitable substrate materials. It is preferable to use a substrate made from silicon or a silicon-containing substrate, for example an SiC substrate. Silicon is inexpensive and advantageously has a significantly lower coefficient of thermal expansion, relative to many other semiconductor materials, than the nitride compound semiconductor materials which are conventionally used.

It is preferable for an ELOG process to be used to grow the semiconductor material. A coalescence region is formed in the semiconductor material as a result of the lateral growth and of semiconductor material from different regions of the substrate and/or if appropriate the initial layer growing together. The coalescence region is the region in which the growing layers from at least two different regions meet and grow together.

It is preferable for the semiconductor material and/or the component layer sequence to be grown by means of an MOVPE process. Lateral growth is promoted by suitably setting the growth conditions, such as for example the pressure, the temperature, the V/III ratio and/or by the introduction of $Cp_2Mg$ or TMIn. In the present instance, preferential growth in the facet direction of the pits, i.e. the primary growth of the semiconductor material takes place substantially in a direction which runs perpendicular to the facets of the pits. Accordingly, the regions between the facets are filled by lateral growth, which ultimately leads to the semiconductor material growing together in the pits from the flanks of the pits. Then, the semiconductor material grows in the windows, and after that it grows over the mask layer in the lateral direction starting from the windows until a continuous layer of semiconductor material is present.

The semiconductor material preferably has a substantially planar surface after it has grown together. This preferably provides a substantially lattice-matched semiconductor material with few crystal faults or defects as a basis for the growth of the component layer sequence.

Prior to the growth of the semiconductor material, it is possible for an initial layer or buffer layer to be applied to the substrate. An initial layer or buffer layer of this type can be used, inter alia, to improve the crystal quality of the semiconductor material which is subsequently grown. It can be applied to the substrate before or after the mask layer has been applied. If it is applied before the mask layer, it is preferably applied to the entire surface of the substrate and then the mask layer is applied to the buffer layer. On the other hand, if it is applied after the mask layer, it is preferably applied to the substrate only in the windows in the mask layer.

It is preferable to use a mask layer which contains silicon nitride (SiN). In the present context and in the text which follows, SiN is to be understood as meaning all existing silicon nitrides $Si_xN_y$, i.e. for example including $Si_3N_4$.

In a further advantageous embodiment, the mask layer has a lattice-like or mesh-like structure.

The semiconductor material may have a single epitaxy layer or a plurality of epitaxy layers formed from different semiconductor compounds.

In a further embodiment, in accordance with the above-listed method steps (a) to (c), a first semiconductor material is grown and then a second mask layer is preferably applied to the first semiconductor material. The second mask layer has windows leading to the first semiconductor material. Then, a second semiconductor material is applied to the first semiconductor material in the windows in the second mask layer. The second semiconductor material grows over the second mask layer and, analogously to step (c), in each case forms coalescence regions between two adjacent windows over the mask layer. The second semiconductor material, after it has grown together and if appropriate after further growth of the semiconductor material, preferably has a planar surface which is intended for the component layer sequence to grow on. Before the second semiconductor material is grown, it is possible for pits to be etched into the first semiconductor material in the windows in the second mask layer, analogously to step (b).

The steps explained above can be repeated a number of times before the component layer sequence is grown on. The various semiconductor materials may have identical or different compositions and/or thicknesses.

The component layer sequence preferably includes at least one active region, which in operation emits electromagnetic radiation, preferably a light-emitting diode structure or a laser diode structure.

The method is particularly suitable for the growth of a component layer sequence which includes a compound of elements from the main groups III and V, particularly preferably a nitride compound semiconductor material, such as for example GaN, AlN, InGaN, AlGaN, AlInN and/or AlInGaN. However, the method is fundamentally also suitable for the growth of other semiconductor materials, such as for example InGaAlP-based materials.

The semiconductor material is preferably designed as a single semiconductor layer or as a semiconductor layer sequence. It is preferable for the mask layer, the semiconductor material and the component layer sequence to be grown epitaxially in situ in an epitaxy reactor during one epitaxy run. If appropriate, the initial or buffer layer is also grown at the same time. However, the latter may also have been applied to the substrate in advance.

A method according to the invention on the one hand stops vertical propagation of defects at the masked regions through the mask layer and on the other hand diverts defects in the substrate and/or if present in the initial layer, which meet the pit facets, substantially toward the center of the pits on account of the lateral growth therein, and these defects end at or open out into the coalescence region.

A preferred method according to the invention advantageously uses special method steps in situ during the epitaxial growth to bring about a reduction in defects in particular in the component layer sequence. Ex-situ measures, such as the application of mask layers outside the epitaxy reactor, photolithography and etching are not required for the method steps according to the invention. The wafer can remain in the epitaxy reactor throughout all the process steps according to the invention.

The method is suitable for use for the fabrication of GaN-based semiconductor components as described, for example, in the European patent application bearing the application number 03003442.5. The content of disclosure of this European patent application is hereby expressly incorporated by reference.

BRIEF DESCRIPTION OF THE DRAWINGS

Further advantages, preferred embodiments and refinements of the method and of the electronic semiconductor body will emerge from the exemplary embodiments which are explained in the text below in conjunction with FIGS. 1a to 4, in which.

DETAILED DESCRIPTION OF THE DRAWINGS

Figure 1A:
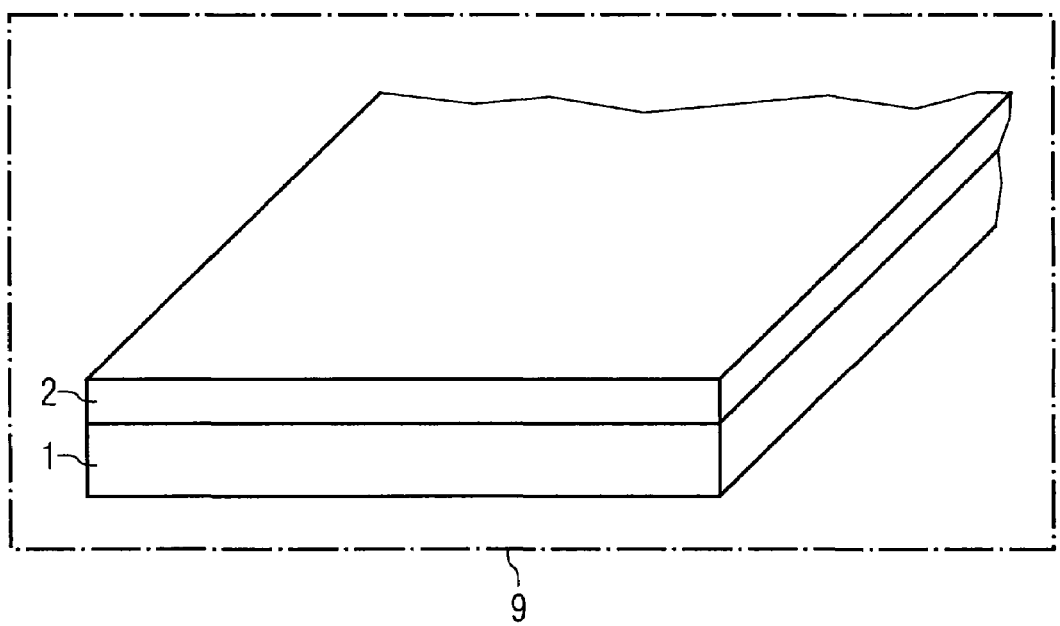
FIGS. 1a to 1d show diagrammatic illustrations (1a and 1ba as perspective views and 1bb to 1d as sectional views) of a wafer during various method stages forming part of a method in accordance with a first exemplary embodiment.

Throughout the exemplary embodiments and figures, identical or equivalent components are in each case provided with identical reference symbols. The layer thicknesses illustrated are not to scale. Rather, their thicknesses are exaggerated for the purpose of improved understanding, and the actual thickness ratios between the layers are not reproduced in the drawings.

Figure 1B:
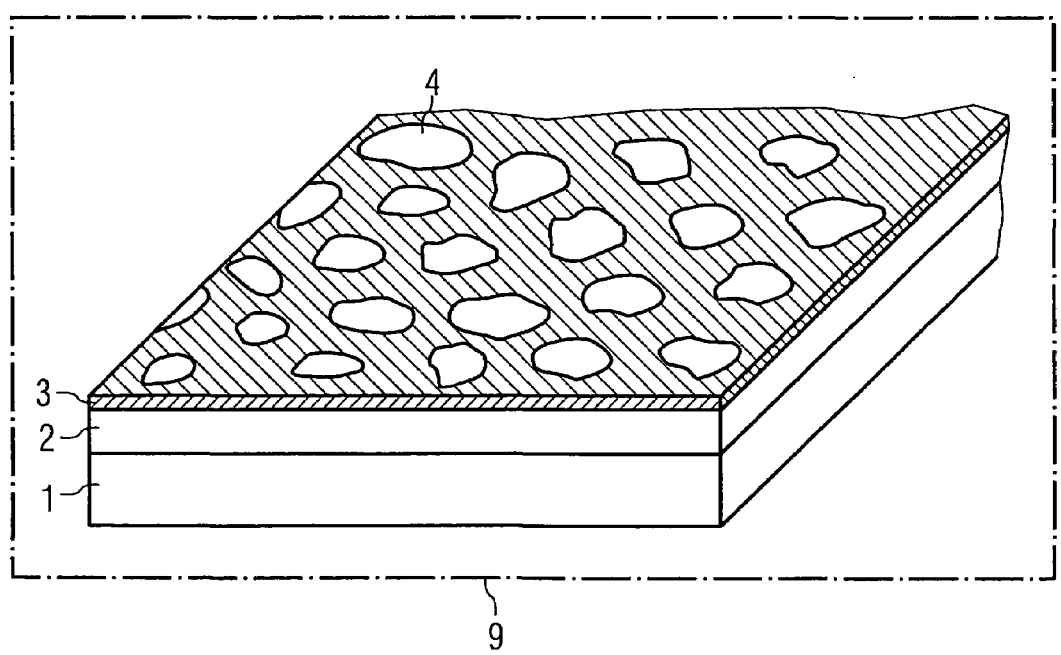
Figure 1B:
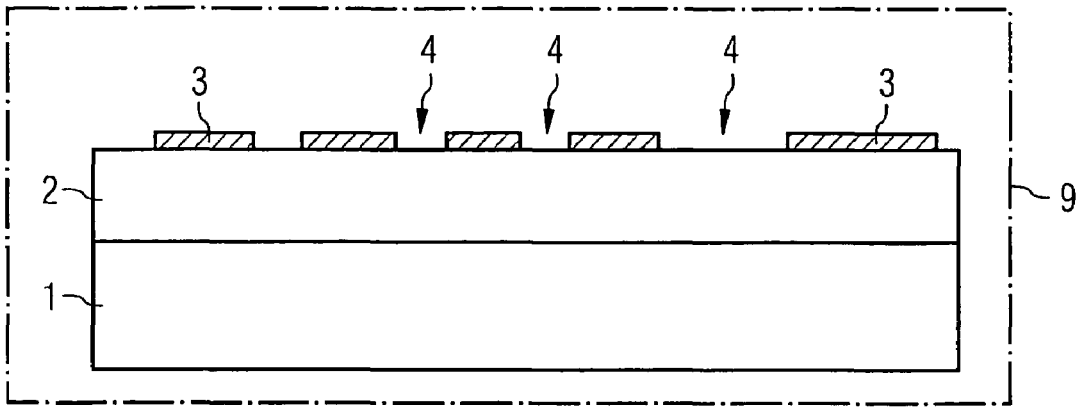

During the method sequence which is diagrammatically depicted in FIGS. 1a to 1d, first of all an initial layer 2 in the form of an AlGaN-based buffer layer or a buffer layer consisting of AlGaN is produced on an SiC-based substrate 1, in particular on a substrate 1 consisting of SiC (FIG. 1a), and then a discontinuous SiN-based mask layer 3 or a discontinuous mask layer 3 consisting of SiN is produced on the buffer layer (FIGS. 1ba and 1bb). The buffer layer 2 and the mask layer 3 are produced in situ in the same MOVPE (metal organic vapor phase epitaxy) epitaxy reactor (indicated by dot-dashed line 9).

A discontinuous SiN layer is produced, for example, by the introduction of $SiH_4$ and $NH_3$ at a suitable reactor temperature. Processes of this type are described, for example, in Hageman, P. R. et al, Phys. Stat. Sol. (a) 188, No. 2 (2001), 659-662, and in Wang, T. et al, Journal of Crystal Growth 213 (2000), 188-192, which are hereby in this respect incorporated by reference. Alternatively, it is also possible for tetraethyl-silicon $(Si(C_2H_5)_4)$ or a similar Si-containing compound which is suitable for epitaxy to be used as the Si source.

The mask layer 3 has, randomly distributed, a multiplicity of windows 4 which are fundamentally of different sizes and shapes and lead to the initial layer 2.

Figure 1C:
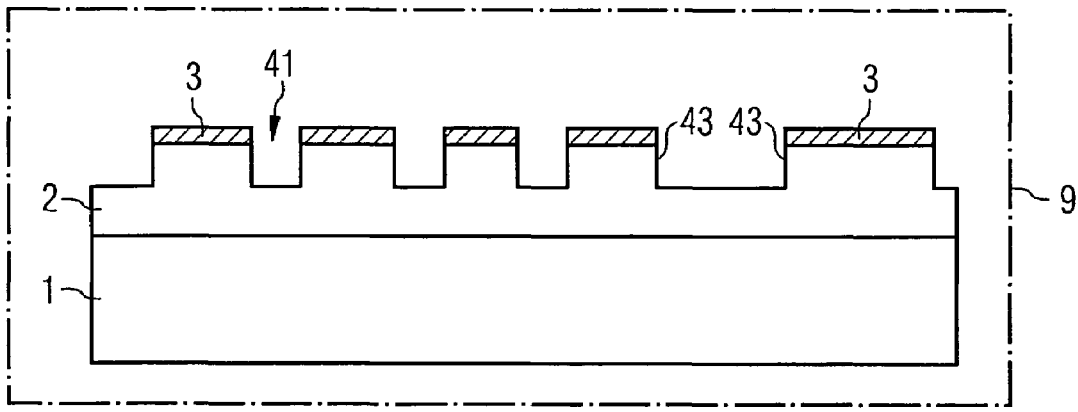

Then, pits 41 are etched into the initial layer 2 in situ in the windows 4 in the mask layer 3 (FIG. 1c). This step is carried out, for example, under an $NH_3$ atmosphere with the temperature elevated to above the desorption temperature of the initial layer 2 in the epitaxy reactor. Alternatively, the etching can also be effected by increasing the temperature to above the desorption temperature without the use of an $NH_3$ atmosphere or by the introduction of alternative etching gases, such as HCl or other chlorine- and/or hydrogen-containing gases at a suitable reactor temperature.

The shape of the pits 41 and therefore of the etched facets of the initial layer 2 can be influenced in a controlled way, for example by varying the reactor pressure, temperature and/or gas composition (cf. in this respect FIGS. 2a, 3 and 4), so that during subsequent overgrowth propagation of the defects in the vertical direction can be suppressed as fully as possible. By way of example, it is possible to form pits with vertical, steep, shallow and/or multiply stepped facets.

Figure 1D:
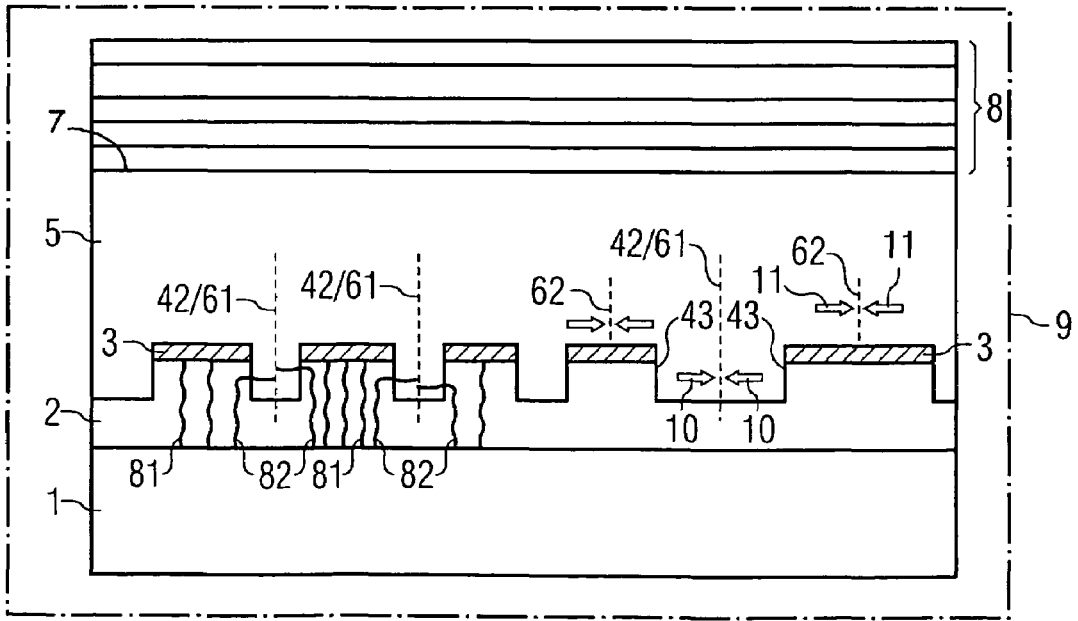

After the pits 41 have been etched, a semiconductor material 5, for example having the composition $In_xAl_yGa_{1-x-y}N$, where $0 \leq x \leq 1$, $0 \leq y \leq 1$ and $x+y \leq 1$, is grown onto the initial layer 2 in the windows 4 by means of metalorganic vapor phase epitaxy (cf. FIG. 1d). Lateral growth is promoted by suitably setting the growth conditions, such as for example the pressure, the temperature, the V/III ratio and/or the introduction of $Cp_2Mg$ or TMIn. In the present instance, therefore, preferential growth in the facet direction of the pits 41 is achieved, i.e. the primary growth of the semiconductor material 5 takes place substantially in a direction which runs perpendicular to the facets 43 of the pits 41. Accordingly, the regions between the facets 43 are filled by lateral growth, which ultimately leads to the semiconductor material 5 in the pits 41 growing together from the flanks of the pits 41. As the method continues, the semiconductor material 5 in the windows 4 grows and then, from the windows, overgrows the mask layer 3 in the lateral direction until a continuous layer of semiconductor material is present. During this procedure, on the one hand vertical propagation of defects 81 is stopped at the masked regions by the mask layer 3, and on the other hand defects 82 which come into contact with the pits are bent off toward the center of the pits on account of the lateral growth in the pits (cf. FIGS. 1d and 2b).

Processes for lateral growth are described, for example, in the documents Beaumont, B. et al. Phys. Stat. Sol (b) 227(2001), No. 1, pp. 1-43; Li, X. et al, Applied Physics Letters (1998), Vol. 73, Number 9, p. 1179-1181; Song, Y. H. et al, Phys. Stat. Sol. (a) 180(2000), pp. 247-250; and Zheleva, T. S. et al, MRS Internet J. Nitride Semicond. Res. 4Sl, G3.38 (1999), which are hereby in this respect incorporated by reference.

The semiconductor material 5 therefore initially grows primarily from the facets 43 of the pits 41 toward the center 42 thereof, where it forms a coalescence region 61. The arrows 10 indicate the growth direction in this respect. Defects 82 in the initial layer 2 which come into contact with facets 43 of the pits 41 bend off in the semiconductor material 5 toward the pit center 42 and end in or open out into the coalescence region 61. Then, starting from the windows 4, the semiconductor material 5 overgrows the mask layer 3 and in each case forms a further coalescence region 62 between adjacent windows 4 over the mask layer 3. Therefore, the semiconductor material 5 from adjacent windows 4 grows together over the mask layer 3. The arrows 11 indicate the direction of growth in this respect.

Other epitaxial growth processes, such as ELOG or a process which allows similar growth may alternatively be provided.

After the semiconductor material 5 has grown together over the mask layer 3, a preferably planar or substantially planar surface 7 of the semiconductor material 5, which is suitable for a component layer sequence 8 to grow on, is formed by further growth of semiconductor material 5. Next, the component layer sequence 8 is grown on this surface 7, remote from the substrate 1, of the semiconductor material 5 (FIG. 1d). This component layer sequence is based, for example, on nitride compound semiconductor materials as have already been explained in the introduction. The component layer sequence 8 has, for example, a light-emitting diode structure or a laser diode structure. Component structures of this type are known to the person skilled in the art and include, for example, a conventional pn junction, a double heterostructure, a single quantum well structure (SQW structure) or a multiple quantum well structure (MQW structure). Examples of MQW structures of this type are described in the documents WO 01/39282, WO 98/31055, U.S. Pat. No. 5,831,277, EP 1 017 113 and U.S. Pat. No. 5,684,309, the content of disclosure of which in this respect is hereby incorporated by reference.

The assembly comprising substrate 1, initial layer 2, mask layer 3, semiconductor material 5 and component layer sequence 8 can then, if appropriate after application of contact structures and/or contact metallizations, be divided up into semiconductor bodies by means of conventional methods, for example by means of sawing or scoring and breaking.

In a variant of the exemplary embodiment, the initial layer 2 is omitted, and the mask layer 3 is applied direct to the substrate 1.

Unless indicated otherwise, the above statements relating to the first exemplary embodiment also apply to the further exemplary embodiments explained below.

Figure 2A:
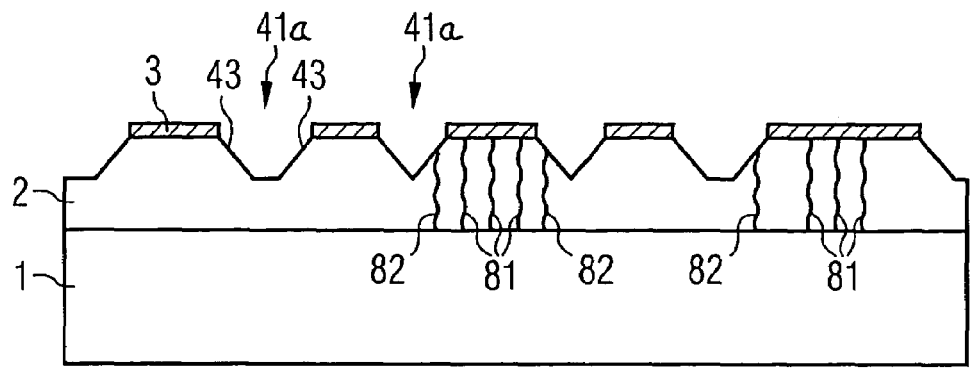
FIGS. 2a and 2b show diagrammatic sectional illustrations through a wafer at different method stages forming part of a method in accordance with a second exemplary embodiment.
Figure 2B:
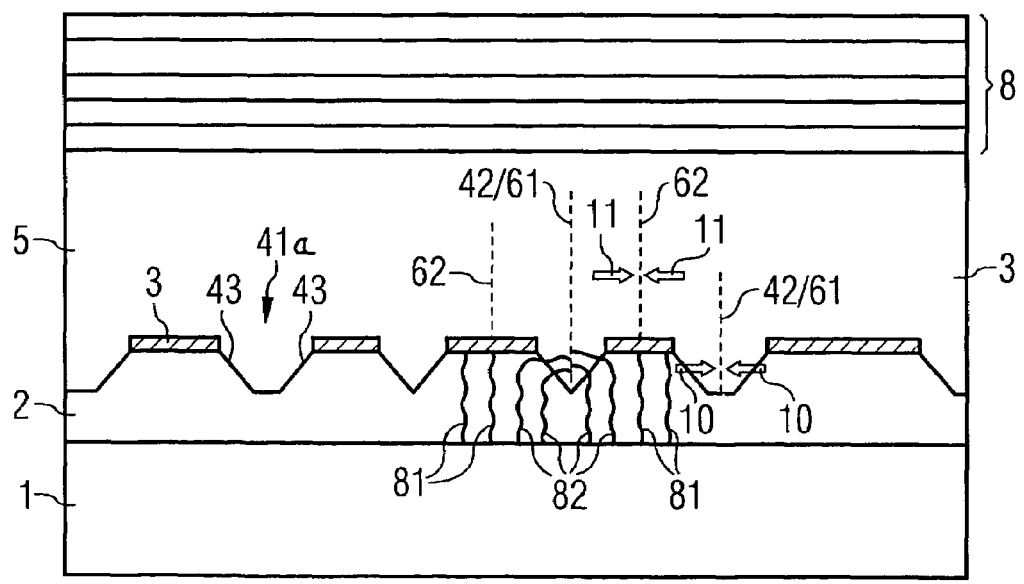

FIGS. 2a and 2b diagrammatically depict method steps of an alternative method sequence in accordance with a second exemplary embodiment, corresponding to method steps described in connection with FIGS. 1c and 1d. The second exemplary embodiment differs from the first exemplary embodiment in particular by virtue of the fact that during the etching-back step pits 41a with inclined side flanks are produced by deliberately changing the settings of the etching parameters, so that the pits 41a narrow as their depth increases.

Otherwise, the basic method is unchanged from the first exemplary embodiment.

Figure 3:
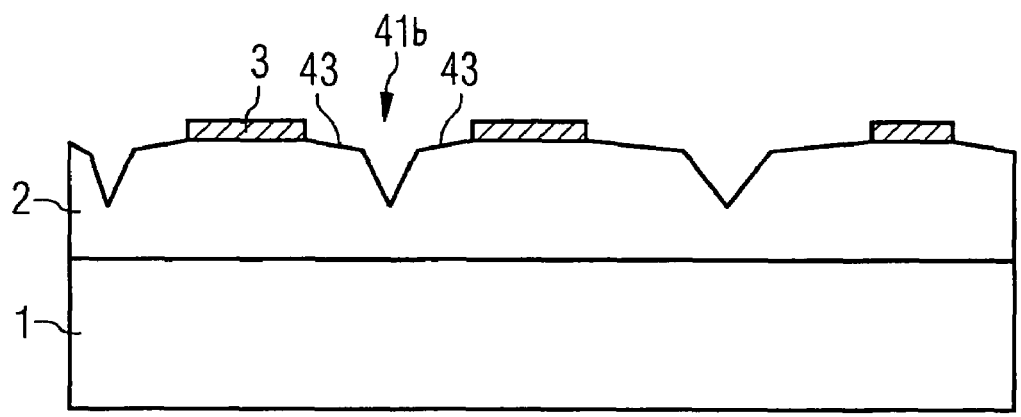
FIG. 3 shows a diagrammatic sectional illustration through a wafer in a specific method stage forming part of a method in accordance with a third exemplary embodiment.
Figure 4:
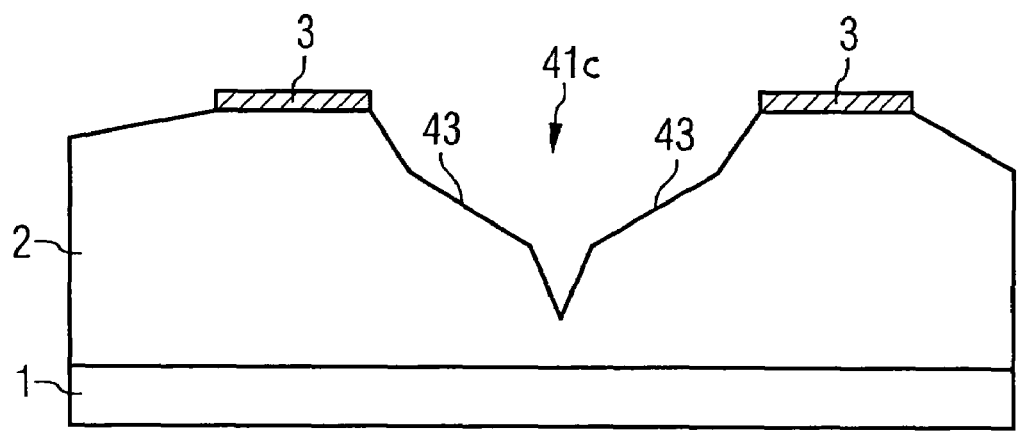
FIG. 4 shows a diagrammatic sectional illustration through a wafer during a specific method stage forming part of a method in accordance with a fourth exemplary embodiment.

The sectional illustrations through wafers 1, 2, 3 shown in FIGS. 3 and 4 after the pits have been etched use two different pit shapes to illustrate the fact that different configurations can be implemented by varying the etching parameters. In the case of the wafer shown in FIG. 3, the side faces 43 of the pits 41b, starting from the boundary with the mask layer 3, are initially shallow and then become steeper. In the case of the wafer shown in FIG. 4, the side faces 43 of the pits 41c are initially steep, then merge into a shallower section before then becoming steeper again and meeting at the bottom.

Semiconductor bodies with a high crystal quality can be fabricated with the aid of the method according to the invention.

It is optionally possible for the method steps shown in FIGS. 1a to 1d and the corresponding method steps of the further exemplary embodiments apart from the growth of the component layer sequence 8 to be repeated a number of times before the component layer sequence is grown on. In this case, a plurality of mask layers and semiconductor material layers are alternately produced on top of one another. This makes it possible to further reduce the levels of dislocations in the semiconductor material in order to create a further improved base for the growth of the semiconductor layer sequence.

Of course, the description of the method with reference to the exemplary embodiments is not to be understood as constituting any restriction of the invention to these exemplary embodiments. Rather, the method can also be used for other material systems in which similar problems exist. Moreover, the invention encompasses every novel feature and every combination of features, which in particular includes every combination of features in the patent claims, even if this combination is not explicitly indicated in the patent claims.

The invention claimed is:

1. A method for fabricating a plurality of semiconductor bodies, comprising:
   (a) forming a mask layer directly on a substrate comprising at least one material from the group consisting of silicon, silicon carbide and sapphire which mask layer has a plurality of windows leading to the substrate and onto which mask layer a semiconductor material, which is to be grown onto the substrate in a subsequent method step, substantially cannot be grown or can be grown to a significantly reduced extent by comparison with the substrate,
   (b) etching back the substrate in the windows, in such a manner that pits are formed in the substrate starting from these windows,
   (c) growing the semiconductor material onto the substrate, in such a manner that lateral growth is promoted and (i) the semiconductor material initially grows primarily from the flanks of the pits toward the center of the pits where the semiconductor material forms a coalescence region, so that defects in the substrate which impinge on the flanks of the pits bend off toward the center of the pits in the semiconductor material, and then (ii) the semiconductor material, starting from the windows, grows over the mask layer and in each case grows together over the mask layer between adjacent windows, where the semiconductor material forms a further coalescence region, and
   (d) growing a component layer sequence onto the semiconductor material.

2. The method as claimed in claim 1, in which the growth of the semiconductor material is effected by means of metalorganic vapor phase epitaxy in an epitaxy reactor and mask material is applied to the substrate in the epitaxy reactor in such a manner that a discontinuous mask layer is formed, in which the windows leading to the substrate are already formed during the deposition of the mask layer.

3. The method as claimed in claim 1, in which a cross section of the pits perpendicular to the plane of the substrate is formed in a V shape or a U shape.

4. The method as claimed in claim 1, in which the semiconductor material includes a plurality of layers of different compositions.

5. The method as claimed in claim 1, in which the semiconductor material is grown using an ELOG technique.

6. The method as claimed in claim 1, in which the semiconductor material which has grown has a substantially planar surface.

7. The method as claimed in claim 1, in which the mask layer has a lattice-like or mesh-like structure.

8. The method as claimed in claim 1, in which the mask layer contains silicon nitride.

9. The method as claimed in claim 1, in which at least one element from the group consisting of the semiconductor material and the component layer sequence contains a compound of elements from the main groups III and V.

10. The method as claimed in claim 1, in which at least one element from the group consisting of the semiconductor material and the component layer sequence contains a nitride compound semiconductor material.

11. The method as claimed in claim 1, in which the semiconductor material contains a composition selected from the system $In_xAl_yGa_{1-x-y}N$, where $0 \leq x \leq 1$, $0 \leq y \leq 1$ and $x+y \leq 1$.

12. The method as claimed in claim 1, wherein the plurality of semiconductor bodies comprise nitride compound semiconductor material.

13. An electronic semiconductor body, comprising:
    (a) a mask layer arranged directly on a substrate comprising at least one material from the group consisting of silicon, silicon carbide and sapphire, said mask layer having a plurality of windows leading to the substrate, and a semiconductor material arranged above the substrate, wherein said semiconductor material is constituted such that it substantially cannot be grown on the mask layer or can be grown on the mask layer to a significantly reduced extent in comparison with the substrate;
    (b) pits in the substrate located within said windows, said pits being filled by the semiconductor material in such a manner that the semiconductor material has initially grown primarily from the flanks of the pits toward the center of the pits;
    (c) at least one first coalescence region of the semiconductor material located in the pits, such that defects in the substrate which impinge on the flanks of the pits bend off toward the center of the pits in the semiconductor material;
    (d) at least one second coalescence region located over the mask layer and between adjacent windows, said second coalescence region being surrounded by the semiconductor material; and
    (e) a component layer sequence on the semiconductor material.

14. The electronic semiconductor body as claimed in claim 13, which is a radiation-emitting semiconductor chip.

15. A method for fabricating a plurality of semiconductor bodies, comprising:
    (a) forming a first mask layer over an underlying layer, wherein said first mask layer has a plurality of windows onto the underlying layer, and wherein said underlying layer comprises at least one of a substrate and an initial layer;
    (b) etching, through the windows in the first mask layer, pits in the underlying layer; and
    (c) depositing a first semiconductor material by:
        (i) growing said first semiconductor material laterally from flanks of said pits in the underlying layer, wherein a first coalescence region is formed substantially in the center of each of said pits, wherein defects in the underlying layer which contact the sides of said pits propagate in said first semiconductor material in a lateral direction toward said first coalescence regions; and
        (ii) growing said first semiconductor material outward from said windows, as said windows become full of deposited first semiconductor material, over said first mask layer, wherein second coalescence regions are formed above said first mask layer;
    (d) forming a second mask layer on the first semiconductor material, said second mask layer having a plurality of windows onto the first semiconductor material; and
    (e) through the windows of the second mask layer, depositing a second semiconductor material on said first semiconductor material.

16. The method as claimed in claim 15, wherein the plurality of semiconductor bodies comprise nitride compound semiconductor material.

17. The method as claimed in claim 15, further comprising forming a layer of said second semiconductor material above both said second mask layer and said first semiconductor material.

18. The method as claimed in claim 17, further comprising forming a substantially planar surface on said layer of said second semiconductor material.

19. The method as claimed in claim 18, further comprising growing a sequence of component layers on said substantially planar surface.

* * * * *